United States Patent
Imafuji et al.

(10) Patent No.: US 7,093,356 B2
(45) Date of Patent: Aug. 22, 2006

(54) METHOD FOR PRODUCING WIRING SUBSTRATE

(75) Inventors: Kei Imafuji, Nagano (JP); Tadashi Kodaira, Nagano (JP); Takeshi Chino, Nagano (JP); Jyunichi Nakamura, Nagano (JP); Miwa Abe, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 376 days.

(21) Appl. No.: 10/661,530

(22) Filed: Sep. 15, 2003

(65) Prior Publication Data

US 2004/0060174 A1  Apr. 1, 2004

(30) Foreign Application Priority Data

Sep. 17, 2002  (JP) .............................. 2002-269962

(51) Int. Cl.
*B05D 5/12* (2006.01)
*C25D 5/02* (2006.01)
*H01L 21/461* (2006.01)
*H01L 21/4763* (2006.01)
*H05K 3/20* (2006.01)
*H05K 3/34* (2006.01)
*H05K 3/36* (2006.01)

(52) U.S. Cl. ............................. 29/847; 29/840; 29/852; 29/830; 29/831; 205/118; 205/125; 216/18; 427/97.7; 427/117; 438/618; 438/622; 438/754

(58) Field of Classification Search ............... 29/825, 29/830, 831, 835, 846, 847, 852, 832, 840; 438/618, 622, 629, 638, 642, 745, 754; 205/118, 205/125; 216/13–19; 228/180.22; 427/97.7, 427/117, 123

See application file for complete search history.

(56) References Cited

U.S. PATENT DOCUMENTS

| | | | | |
|---|---|---|---|---|
| 4,125,441 A | * | 11/1978 | Dugan ........................ | 205/78 |
| 5,072,520 A | * | 12/1991 | Nelson ........................ | 29/852 |
| 5,245,751 A | * | 9/1993 | Locke et al. .................. | 29/852 |
| 5,326,412 A | * | 7/1994 | Schreiber et al. ........... | 156/150 |
| 5,738,530 A | * | 4/1998 | Schreiber et al. ............. | 439/66 |
| 5,762,845 A | * | 6/1998 | Crumly ..................... | 264/104 |
| 5,855,063 A | * | 1/1999 | Schreiber et al. ............. | 29/848 |
| 6,166,333 A | * | 12/2000 | Crumly et al. .............. | 174/255 |
| 6,418,615 B1 | | 7/2002 | Rokugawa et al. ........... | 29/852 |
| 6,460,247 B1 | * | 10/2002 | Gregoire ....................... | 29/848 |
| 6,524,892 B1 | * | 2/2003 | Kishimoto et al. ......... | 438/120 |
| 6,662,442 B1 | * | 12/2003 | Matsui et al. ................. | 29/852 |
| 6,664,129 B1 | * | 12/2003 | Siniaguine ................... | 438/107 |
| 6,687,985 B1 | * | 2/2004 | Sakamoto et al. ............ | 29/830 |
| 6,713,376 B1 | * | 3/2004 | Sugihara ..................... | 438/613 |

(Continued)

*Primary Examiner*—Peter Vo
*Assistant Examiner*—Livius Radu Cazan
(74) *Attorney, Agent, or Firm*—Staas & Halsey LLP

(57) ABSTRACT

A wiring substrate with bumps protruding from a surface of the substrate covers one side of a metallic base with an electrical insulating film thereon, having open holes exposing the base, etching the base through the open holes to form concavities in the base, electroplating the interior faces of the concavities to form a barrier metal film thereon filling the concavities with a bump material by electroplating, and forming a barrler layer on the bump material in each concavity. A stack of wiring patterns is formed on the insulating film, adjacent wiring patterns being separated by a respective intervening insulating layer and being electrically connected to each other through vias in the intervening insulating layer, and to the bump material filled in the concavities. Thereafter, the base and barrier metal film are removed.

13 Claims, 4 Drawing Sheets

U.S. PATENT DOCUMENTS 6,782,610 B1* 8/2004 Iijima et al. .................. 29/827
2002/0001937 A1 1/2002 Kikuchi et al. ............. 257/680
2003/0080409 A1* 5/2003 Nakamura et al. .......... 257/700

* cited by examiner

METHOD FOR PRODUCING WIRING SUBSTRATE

BACKGROUND OF THE INVENTION

1. Field of the Invention

The invention relates to a method for producing a wiring substrate. More particularly, the invention relates to a method for producing a wiring substrate provided with connecting bumps and wiring patterns by the use of a base made of a metal.

2. Description of the Related Art

As a method of producing a wiring substrate, there is a method in which bumps to be subsequently connected to electrodes of a semiconductor element and a wiring pattern connected to the bumps are formed on one side of a base made of a metal, typically copper, and the base is then dissolved for removal, to thereby produce a wiring substrate, as described in JP 2000-323613 A and JP 2002-83893 A.

For the formation of the wiring pattern on a base, a common method for producing a wiring substrate can be applied. For example, a method for forming a wiring layer having a given pattern by forming an insulating layer on a base, forming via holes in the insulating layer, subsequently forming a plating seed layer on the surface of the insulating layer and on the interior faces of the via holes, carrying out electroplating using the base as an power supply layer for the plating to thereby forming a conductor layer on the surface of the insulating layer and on the interior faces of the via holes, and etching the conductor layer, may be used.

As a method for forming bumps to be connected to electrodes of a semiconductor element by plating during the manufacture of a wiring substrate using a base, there is a method for forming protruding solder bumps by concavely etching a surface of a base at the locations corresponding to bumps, carrying out electroplating of solder using the base as an power supply layer for the plating to thereby fill the concavities formed in the base with the solder, and then dissolving the base for removal.

When the solder bumps are formed in the substrate at the locations corresponding to electrodes of a semiconductor element, for the manufacture of a wiring substrate using the base, high precision bump formation is needed because of the small size of the electrode and the small distance between adjacent electrodes, and the bump to be joined to the electrode has a small contact area with the substrate because of its very small size, which may lead to a problem of joining the substrate with the solder bump.

In the manufacture of a wiring substrate using a base, as described above, heat treatment is carried out in order to, for example, heat and cure an insulating layer during the formation of the insulating layer and a wiring pattern on the base. In the case where a wiring substrate provided with solder bumps is formed, there is a problem that the surface of the solder bump is discolored during the heat treatment. It is believed that this is because copper (Cu) used for the base and tin (Sn) in the solder mutually diffuse, to thereby form a compound phase at the interface between the solder and the base. The discolored solder bump surface impairs the appearance of the bump, and also causes problems of, for example, reduced reliability of the electrical connection between the solder bumps and electrodes.

SUMMARY OF THE INVENTION

An object of the invention is to provide a method for producing a wiring substrate, which secures the electrical connection between the substrate and a semiconductor element, and can be produced easily and with high reliability.

According to the invention, there is provided a method for producing a wiring substrate provided with bumps protruding from a surface of the substrate, the method comprising the steps of: covering one side of a metallic base with an electrical insulating film and forming open holes in the insulating film so as to expose at the bottoms thereof the base, etching the base using the insulating film having the open holes formed as a mask to form concavities in the base, electroplating the interior face of each of the concavities using the base as a plating power supply layer to form a barrier metal film on the interior face of each concavities, filling the concavities with a material for the bump by electroplating using the base as a plating power supply layer, forming a barrier layer on the surface of the material for the bump filled in each of the concavities using the base as a plating power supply layer, forming a stack of a predetermined number of wiring patterns on the insulating film, the adjacent wiring patterns in the stack being separated from each other by an intervening insulating layer and being connected to each other through vias formed in the intervening insulating layer, and the wiring patterns being electrically connected to the material for the bump filled in the concavities, removing the base from the stack of wiring patterns having bumps each having the barrier metal film, and removing the barrier metal film from each of the bumps.

Preferably, a large-sized metallic foil is used as the base, for simultaneous production of a plurality of wiring substrates.

Preferably, two metallic bases laminated by joining them by adhering the peripheries thereof are used, and the opposed sides of the laminate are covered with the electrical insulating film.

Preferably, open holes are formed in the insulating film so as to have tapered interior faces providing a larger diameter at the opening side rather than at the bottom exposing the base.

Preferably, the etching used to etch the base for the formation of the concavities is isotropic, and each of the concavities is formed to have a diameter at the interface with the insulating film, which is larger than the bottom diameter of the hole provided in the insulating film.

Preferably, the concavities are filled with the material for the bump in such a manner that the material fully fills the concavity, and partially protrudes into the open hole in the insulating film.

Preferably, the base is made of copper.

More preferably, the base is a foil of copper.

Preferably, the base is removed by etching.

Preferably, the bumps are formed of solder or gold.

Preferably, the barrier metal film is formed of nickel or cobalt.

Preferably, the barrier layer on the surface of the material for bump filled in each concavity is formed of nickel.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

FIGS. 1A to 1M illustrate an embodiment of the invention, which represents the production of a wiring substrate provided with solder bumps on which a semiconductor element is to be mounted.

In this embodiment, a wiring substrate is produced by laminating two sheet-like bases made of a metal, forming solder bumps and wiring patterns on one side of each of the bases, dividing the laminated bases into two, and then dissolving each base for removal. The manufacturing process of the wiring substrate will now be described.

Figure 1A:
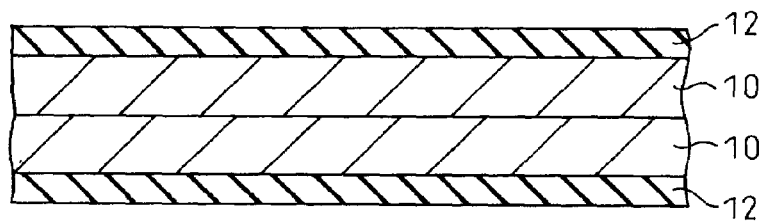
FIGS. 1A to 1M illustrate an embodiment of the method for producing a wiring substrate of the invention.

As shown in FIG. 1A, the opposed sides of the laminate of two bases 10, which form a core, are respectively covered with an insulating layer 12 exhibiting electrically insulating properties. The insulating layer 12 may be formed by laminating a electrically insulative resin film, such as a film of polyimide, to the base 10.

In this embodiment, a large-sized copper foil is used as the base 10, and a laminate of two large-sized bases 10 is used as a support. The bases 10 are laminated by joining narrow sites along the peripheries of the bases 10 to each other using an adhesive. When the bases 10 are subsequently separated from each other, they are cut inside the adhered sites.

Figure 1B:
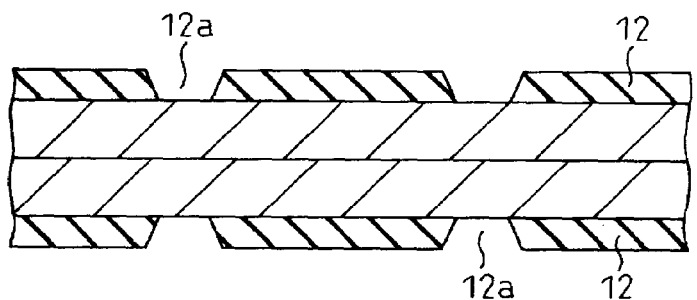

As shown in FIG. 1B, open holes 12a are formed in the insulating layers 12. The open holes 12a are formed so as to be situated at the locations corresponding to electrodes of a semiconductor element to be mounted on a finished wiring substrate and have a size adapted to a diameter of a solder bump to be joined to the electrode. The holes 12a can be formed by laser machining or etching the insulating layer 12. It is preferred that the open holes 12a are formed so as to have tapered interior faces providing a larger diameter at the opening side rather than at the bottom located on the insulating layer 10, as illustrated in the drawing.

Figure 1C:
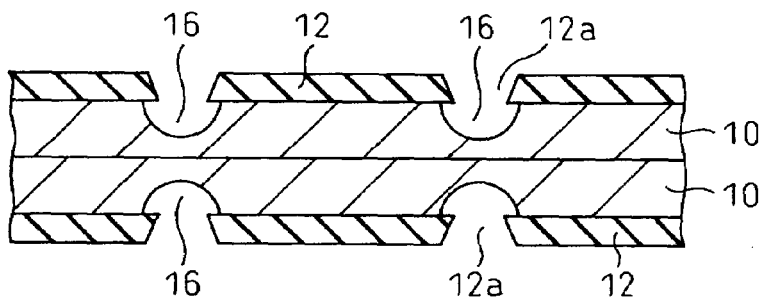

As shown in FIG. 1C, using the insulating layers 12 having the open holes 12a provided as masks, the bases 10 are chemically etched, to thereby create concavities 16 for bump formation. By isotropically etching the base 10 from the bottoms of the open holes 12a, which have a circular cross section, each concavity is formed to have a semispherical interior face and have a diameter at the interface with the insulating layer 12, which is larger than the bottom diameter of the hole 12a provided in the insulating layer 12, as illustrated in the drawing.

Figure 1D:
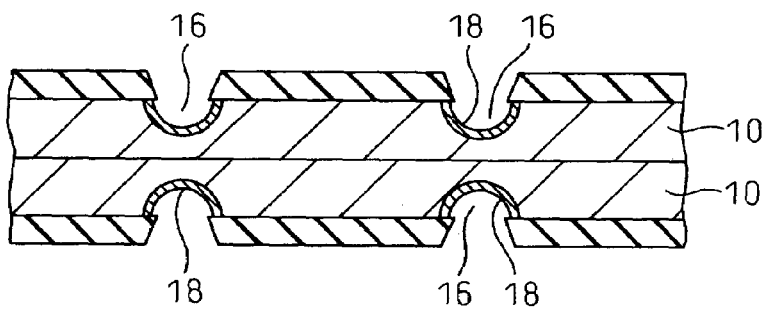

As shown in FIG. 1D, a barrier metal film 18 is formed on the interior face of each of the concavities 16 by electroplating using the base 10 as a plating power supply layer. The barrier metal film 18 is provided so as to cover the entire interior face of the concavity 16, and blocks the formation of a compound phase at the interface between the base 10 of copper and a solder bump. The barrier metal film 18 can be formed by plating with nickel or cobalt. As the barrier metal film 18, a metal, which can be easily removed by etching without etching solder, is used, because the barrier metal film 18 is removed by etching at a subsequent step.

Figure 1E:
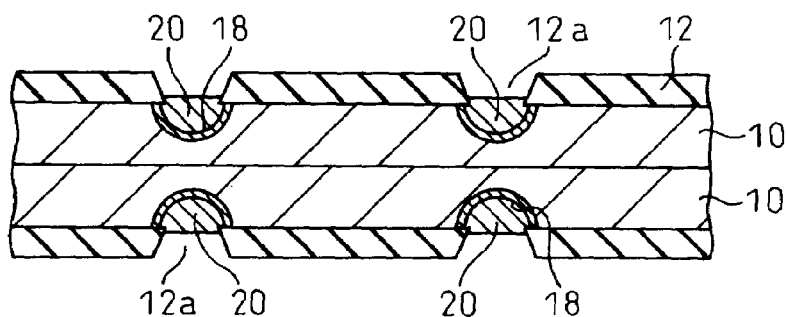

As shown in FIG. 1E, by electroplating using the base 10 as a plating power supply layer, the concavities 16 having the interior faces provided with the barrier metal film 18 (FIG. 1D) are filled with solder 20. As illustrated, the solder plating takes place in such a manner that the solder 20 fully fills the concavity 16, and partially protrudes into the hole 12a in the insulating layer 12. The protrusion of the solder 20 into the hole 12a makes a solder bump hard to be removed from a wiring substrate.

The formation of a plurality of layers of wiring pattern on the base 10 is illustrated in FIGS. 1F to 1I.

Figure 1F:
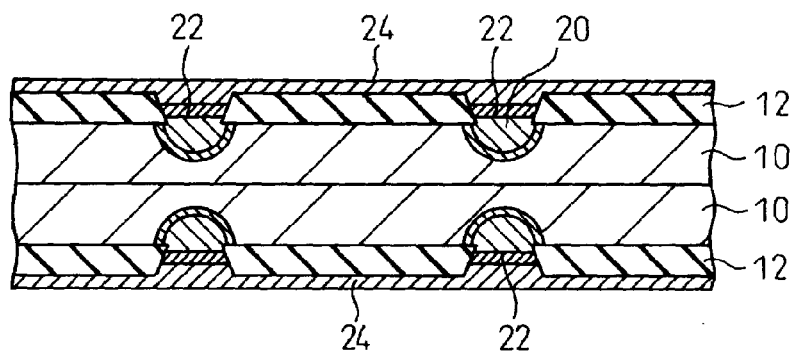
Figure 1G:
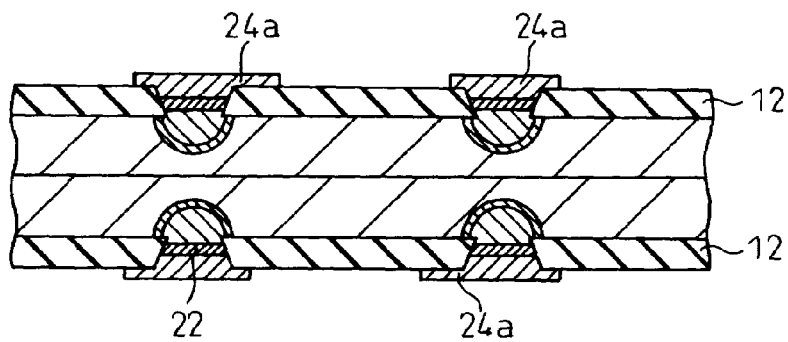

As shown in FIG. 1F, a barrier layer 22 is formed on the surface of the solder 20 filled in the concavity 16 (FIG. 1D) by electroplating using the base 10 as a plating power supply layer, and a copper layer 24 is then formed on the barrier layer 22, which fills the hole 12a (FIG. 1C) and covers the surface of the insulating layer 12, by electroless plating and electroplating with copper. The barrier layer 22 is formed of plated nickel, and serves to block the formation of a compound phase between the solder 20 and a copper layer 24. The copper layer 24 on the insulating layer 12 is then etched to form a wiring pattern (first wiring pattern) 24a having a given pattern, as shown in FIG. 1G.

Figure 1H:
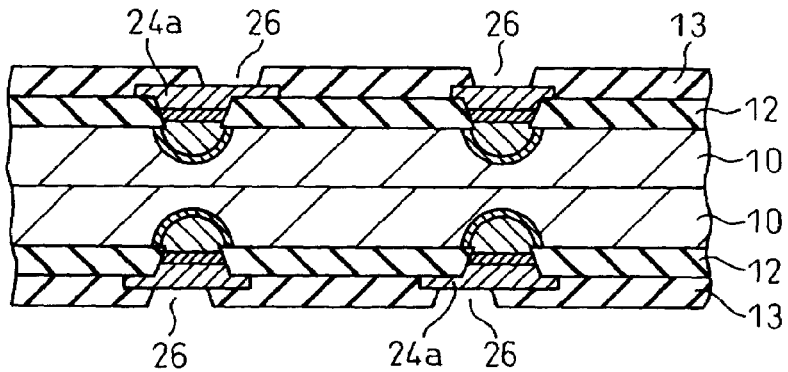
Figure 1:
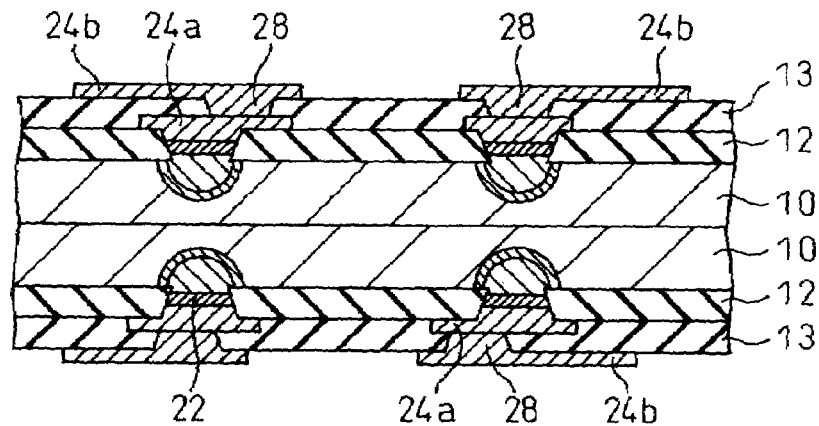
Figure 1:
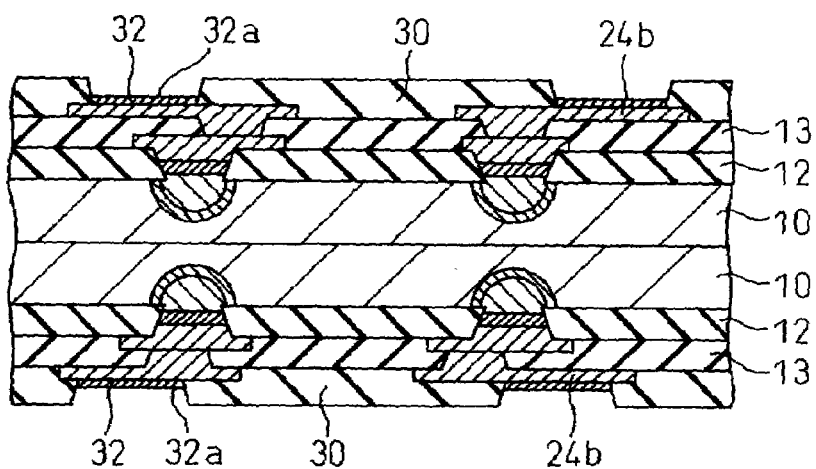
Figure 1:
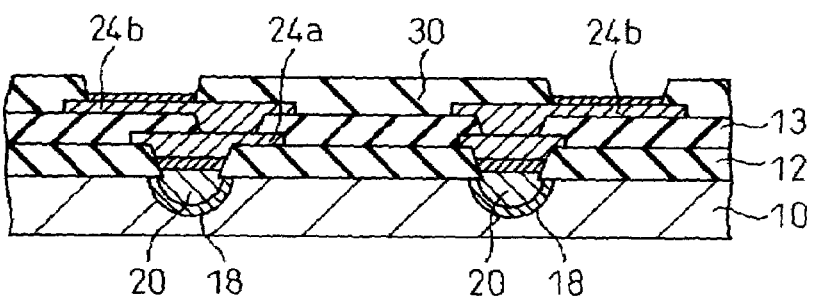

Subsequently, a resin film is laminated to the insulating layer 12 to form a second insulating layer 13 covering the wiring pattern 24a, and via holes 26 are formed in the insulating layer 13 by laser machining, as shown in FIG. 1H. The via holes 26 in the insulation layer 13 may be formed by a method in which an insulating layer is formed of a photosensitive resin film, which is then exposed and developed.

As shown in FIG. 1I, a second wiring pattern 24b is formed by forming a plating seed layer (not shown) on the surface of the insulating layer 13 and inside the via holes 26 (FIG. 1H), forming a copper layer, which fills the via holes 26 and covers the insulating layer 13, by electroplating with copper using the base 10 as a plating power supply layer, and etching the copper layer to provide it with a given pattern. The copper material filled in the via holes 26 forms vias 28, through which the first wiring pattern 24a is electrically connected to the second wiring pattern 24b. The plating seed layer on the insulating layer 13 and inside the via holes 26 may be formed by, for example, electroless plating or a sputtering process.

As shown in FIG. 1J, lands 32, to each of which an external connecting terminal is to joined, are formed by coating the insulating layer 13 and the second wiring pattern 24b with a passivation layer 30 of, for example, a solder resist, and patterning the passivation layer 30 to expose parts of the underlying wiring layer 24b. The land 32 is provided with protective plating film 32a of nickel, gold or the like.

FIG. 1K shows one of the bases 10 separated from the laminate of two large-sized bases by cutting the laminate along the inside of the sites adhering the two bases, the base 10 separated being provided, on its one side, with a given number (two in the embodiment illustrated in the drawing) of layers of wiring pattern and lands in the top layer of wiring pattern.

Figure 1L:
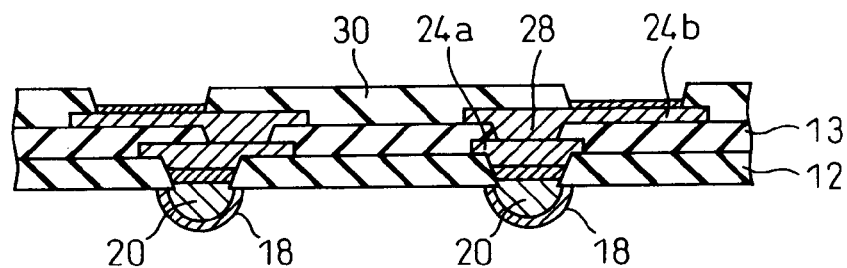

The base 10 is then removed by etching, as shown in FIG. 1L. In the embodiment described herein, the base 10 is of copper material, and the barrier metal film 18 is of nickel or cobalt material, which is not etched by an etchant for the base 10. Thus, only the base 10 can be removed by etching, to thereby expose the solder 20 covered with the barrier metal film 18.

Figure 1M:
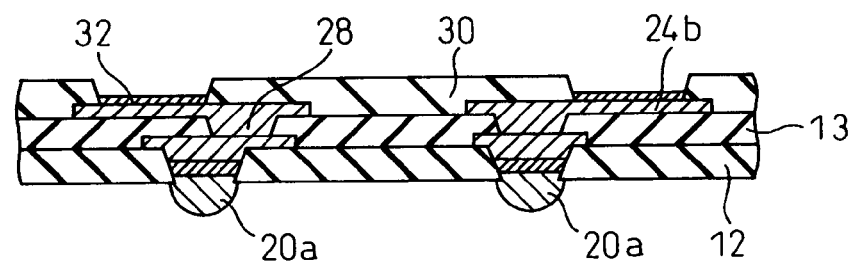

As shown in FIG. 1M, the barrier metal film 18 on the solder 20 (FIG. 1L) is then selectively etched to be removed and to provide a mass of wiring substrates fabricated integrally on the large-sized base 10 and separated therefrom, the wiring substrates having spherical solder bumps 20a protruding from the surface of the insulating layer 12. The barrier metal film 18 can be selectively removed by etching.

After the removal of the barrier metal films 18, the integrally fabricated wiring substrates are cut, along predetermined lines, into individual wiring substrates.

Figure 2:
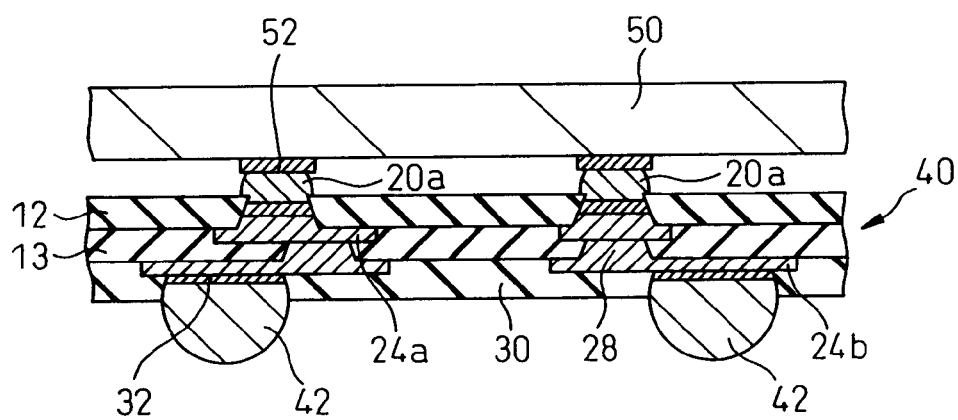
FIG. 2 shows a semiconductor device in which a semiconductor element is mounted on a wiring substrate made according to the method of the invention.

FIG. 2 shows a semiconductor device in which a wiring substrate 40 thus obtained has a semiconductor element 50 mounted thereon. In this semiconductor device, the semiconductor element 50 is mounted on the wiring substrate 40 by joining electrodes 52 provided on the semiconductor element 50 to the solder bumps 20a on the substrate 40, and external connecting terminals 42 made of, for example, solder balls are joined to the lands 32 having protective films 32a, with the external connecting terminals being electrically connected to the semiconductor element 50.

As described above, according to the invention, the wiring substrate is produced by forming the solder bumps 20a using the base 10 as a support, and forming a plurality of layers of wiring pattern 24a, 24b using also the base 10 as a support. On this account, the solder bumps 20a and the wiring patterns 24a, 24b can be formed in such a manner that they are securely held in place so as not to be displaced during the fabrication, which allows the wiring substrate to be produced with high precision. Highly precise alignment is required in the case where solder bumps are formed aligning with electrodes of a semiconductor element, which have a small size and are arranged with a small pitch. According to the invention, which makes a wiring substrate using a base material, a wiring substrate can be produced with required precision and with ease.

The invention has an advantage that a wiring substrate provided with necessary wiring patterns and solder bumps can be obtained efficiently and with ease by forming a stack of wiring patterns with intervening insulating layers on one side of a base, and then dissolving the base for removal.

According to the method of the invention, in which barrier metal films are provided on the interior faces of concavities for bump formation in a base, a compound phase is not formed between the base and a solder material filled in the concavity even when a heat treatment takes place during the production of a wiring substrate. On this account, the problem of the discoloration of solder bumps during the production of a wiring substrate can be securely eliminated, resulting in the enhanced reliability of the junction of the solder bumps to electrodes of a semiconductor element to be mounted on the wiring substrate.

Also, according to the method of the invention, solder bumps are formed by filling a solder material in concavities formed in a base, which is subsequently removed from a finished wiring substrate, and partially in holes in an insulating layer located on the base, each of the concavities having an opening, through which it communicates with the hole and which has a diameter smaller than that of the concavity at the interface with the insulating layer. Thus, the wiring substrate produced according to the method of the invention has an advantage that the solder bumps are securely supported by the constriction at the boundary between the semispherical bump portion protruding from the insulation layer and the portion of the solder material buried in the hole of the insulation layer and, therefore, the bumps can be securely engaged to the main body of the substrate and can be prevented from being detached or removed from the wiring substrate even if the contacting area between the bump and the main body of the substrate is insufficient.

Although, in the embodiment of the invention referred to above, a laminate of two bases is used for a support for the simultaneous, efficient manufacture of wiring substrates on both sides of the laminate, it is also possible to use a single base for the manufacture of a wiring substrate according to the invention.

Further, it is also possible to fill the concavities for bump formation in a base with plated gold or the like, in place of plated solder as used in the embodiment referred to above, to provide a wiring substrate having bumps of a material other than solder, which are securely fixed to the substrate.

Also, although a subtractive process is used for the formation of wiring patterns in the embodiment referred to above, a method of the wiring pattern formation is not limited thereto, and a wiring pattern may be formed on an insulating layer using an additive process, a semi-additive process or the like.

As described, according to the method for producing a wiring substrate of the invention, in which a barrier metal film is formed on the interior face of a concavity in a base prior to the filling of the concavity with solder to form a bump, the formation of a compound phase at the interface between the base and the solder bump can be prevented, and the discoloration of the bump can also be prevented, to thereby provide a wiring substrate having bumps with high joining reliability. In addition, according to the method of the invention, the resin film used for the formation of solder bumps in the base is also used as an insulating layer for the formation of wiring pattern, which allows a wiring substrate having a plurality of layers of wiring patterns, with intervening insulating layers, to be easily manufactured.

The invention claimed is:

1. A method for producing a wiring substrate provided with bumps protruding from a surface of the substrate, the method comprising:
   - covering one side of a metallic base with an electrical insulating film and forming open holes in the insulating film so as to expose, at the bottoms thereof, the base;
   - etching the base using the insulating film, having the open holes formed therein as a mask, to form concavities in the base;
   - electroplating the interior face of each of the concavities, using the base as a plating power supply layer, with a first metal material, different from the material of the base, to form a barrier metal film on the interior face of each of the concavities;
   - completely filling the concavities with a second, bump metal material different from said first metal material, by electroplating, using the base as a plating power supply layer;
   - forming a barrier layer of a third metal material, different from said second metal material, on the surface of the bump material in each concavity, using the base as a plating power supply layer;
   - forming a stack of a predetermined number of wiring patterns on the insulating film, the adjacent wiring patterns in the stack being separated from each other by an intervening insulating layer and being electrically connected to each other through vias formed in the intervening insulating layer and to the bump material in the concavities; and
   - removing the base from the stack of wiring patterns having bumps, each bump having the barrier metal film thereon, and removing the barrier metal film from each of the bumps, thereby producing the wiring substrate.

2. The method of claim 1, wherein a metallic foil is used as the base, of a size permitting simultaneous production of a plurality of wiring substrates.

3. The method of claim 1, wherein two metallic bases laminated by joining them by adhering the peripheries thereof are used, and the opposed sides of the laminate are covered with the electrical insulating film.

4. The method of claim 1, wherein the open holes are formed in the insulating film so as to have tapered interior faces providing a larger diameter at the opening side rather than at the bottom exposing the base.

5. The method of claim 1, wherein the etching used to etch the base for the formation of the concavities is isotropic, and wherein each of the concavities is formed to have a diameter at the interface with the insulating film, which is larger than the bottom diameter of the hole provided in the insulating film.

6. The method of claim 1, wherein the concavities are filled with the material for the bump in such a manner that the material fully fills the concavity, and partially protrudes into the open hole in the insulating film.

7. The method of claim 1, wherein the base is made of copper.

8. The method of claim 7, wherein the base is a foil of copper.

9. The method of claim 1, wherein the base is removed by etching.

10. The method of claim 9, wherein the bumps are formed of solder.

11. The method of claim 1, wherein the bumps are formed of solder or gold.

12. The method of claim 1, wherein the barrier metal film is formed of nickel or cobalt.

13. The method of claim 1, wherein the barrier layer, on the surface of the bump material filled in each concavity, is formed of nickel.

* * * * *

UNITED STATES PATENT AND TRADEMARK OFFICE
CERTIFICATE OF CORRECTION

PATENT NO. : 7,093,356 B2 Page 1 of 1
APPLICATION NO. : 10/661530
DATED : August 22, 2006
INVENTOR(S) : Kei Imafuji et al.

It is certified that error appears in the above-identified patent and that said Letters Patent is hereby corrected as shown below:

Title Page Column 2 (Abstract), Line 8, change "barrler" to --barrier--.

Signed and Sealed this

Tenth Day of April, 2007

JON W. DUDAS
*Director of the United States Patent and Trademark Office*